United States Patent
Hissink et al.

(10) Patent No.: US 8,330,539 B2
(45) Date of Patent: Dec. 11, 2012

(54) DYNAMIC SWITCHABLE MODE DUAL BRIDGE POWER AMPLIFIER

(75) Inventors: Derk-Jan Hissink, Schalkhaar (NL); Fred Mostert, Horssen (NL); Clemens Herman Johan Mensink, Agelo (NL); Adrianus Johannes Maria Tuijl, Nijmegen (NL)

(73) Assignee: NXP B.V., Eindhoven (NL)

( * ) Notice: Subject to any disclaimer, the term of this patent is extended or adjusted under 35 U.S.C. 154(b) by 431 days.

(21) Appl. No.: 12/625,823

(22) Filed: Nov. 25, 2009

(65) Prior Publication Data

US 2011/0123040 A1      May 26, 2011

Related U.S. Application Data

(60) Provisional application No. 61/234,198, filed on Aug. 14, 2009.

(51) Int. Cl.
*H03F 3/00* (2006.01)
*H03F 1/14* (2006.01)

(52) U.S. Cl. .......................... 330/146; 330/51
(58) Field of Classification Search ........... 330/51, 330/69, 84, 124 R, 295
See application file for complete search history.

(56) References Cited

U.S. PATENT DOCUMENTS

| | | |
|---|---|---|
| 3,944,941 A | 3/1976 | Tsuda |
| 4,494,077 A | 1/1985 | Fukaya et al. |
| 4,611,180 A | 9/1986 | Stanley |
| 4,758,796 A | 7/1988 | Verhoeven et al. |
| 4,792,766 A | 12/1988 | Wieschhoff et al. |
| 5,101,170 A | 3/1992 | Torazzine et al. |
| 5,194,821 A | 3/1993 | Brambilla et al. |
| 5,365,188 A | 11/1994 | Botti et al. |
| 5,444,417 A | 8/1995 | Botti et al. |
| 5,621,352 A | 4/1997 | Botti et al. |
| 5,708,390 A | 1/1998 | Dunnebacke |

FOREIGN PATENT DOCUMENTS

| | | |
|---|---|---|
| EP | 1 487 100 A1 | 12/2004 |
| EP | 1 496 611 A1 | 1/2005 |
| EP | 1 548 933 A1 | 6/2005 |

OTHER PUBLICATIONS

Partial European Search Report for European Patent Appln. No. 10172681.8 (Nov. 5, 2010).

*Primary Examiner* — Robert Pascal
*Assistant Examiner* — Khiem Nguyen (57) ABSTRACT

A dual bridge amplifier includes a first bridge amplifier receiving a first input signal and having a pair of drive outputs connecting to a first load, a second bridge amplifier receiving a second input signal and having a pair of drive outputs connecting to a second load, and a mode switch between one of the drive outputs of the first bridge amplifier and one of the drive outputs of the second bridge amplifier. The mode switch closes and switches the dual bridge amplifier to a series amplification mode, based on detecting the magnitudes of the first and second input signals. The series amplification mode shares current between the first load and the second load, reducing amplifier heat generation.

4 Claims, 6 Drawing Sheets

DYNAMIC SWITCHABLE MODE DUAL BRIDGE POWER AMPLIFIER

CROSS-REFERENCES TO RELATED APPLICATIONS

This application claims the benefit of U.S. Provisional Patent Application No. 61/234,198, filed Aug. 14, 2009, entitled "Dual Bridge Power Amplifier With Signal Dependent Configuration Modes."

TECHNICAL FIELD

Embodiments relate generally to dual bridge amplifiers connected to load pairs.

BACKGROUND

Power efficiency is one of the metrics of quality for substantially all electronic amplifiers, and has particular importance in certain applications. Examples of such applications include portable entertainment systems, particularly systems with audio speakers required to deliver high volume with low distortion. As well-known in the amplifier and acoustics arts, such requirements call for the speakers to produce significant sound pressure waves, i.e., rapidly displace large quantities of air, in a manner faithfully reproducing the original music. This requires high power amplifiers capable of pumping high average currents through the speaker drive coils, with adequate headroom to pump substantially higher peak currents, and capable of extremely fast change in value (i.e., a fast slew rate), with low distortion.

In mobile environments, both hand-portable and vehicular, power efficiency thus becomes a significant issue. More particularly, battery considerations and, of particular importance in automobiles, considerations of heat and of loading the vehicle's alternator become an issue. Also, in vehicle-installed systems, amplifiers are often mounted in a tightly packed manner such as, for example, behind automobile dashboards. Further, vehicle occupants often prefer the vehicle interior provide a high quality audio environment. This in turn often drives designs having a significant plurality of speakers such as, for example, a four speaker system (e.g., left front, right front, left rear and right rear), and even an eight speaker system, all of the speakers driven by a high power amplifier.

For these and other reasons, regardless of continuing progress in the audio system technologies, power efficiency and, therefore, heat remains an issue.

For these and other reasons, the present embodiments provide advancements in the art, having various described features, advantages, and benefits as well as others that will be apparent to persons of ordinary skill in the art upon reading this disclosure.

SUMMARY

Various embodiments provide, among other features and benefits, a multi-channel amplifier having significantly higher average power efficiency and significantly lower amplifier heat generation.

Various embodiments further provide, among other features and benefits, a multi-channel amplifier having significantly higher average power efficiency, through a novel switch arrangement outside of the signal path, without substantial switching noise.

Various embodiments further provide, among other features and benefits, a multi-channel amplifier, having a scalability aspect to readily configure a two channel, or an amplifier with at least four channels, having significantly higher average power efficiency and, therefore, significantly lower amplifier heat generation, and further capable of providing, through particular arrangements of a plurality of switches, each outside of the signal path, substantially no added switching noise.

Various embodiments further provide, among other features and benefits, a high-efficiency circuit architecture capable of retrofit to existing dual bridge amplifiers, without significant re-design.

One exemplary embodiment may include a dual bridge dynamically switched amplifier, hereinafter termed a "dual mode class SB amplifier," comprising a first bridge amplifier having an outer drive terminal and an inner drive terminal connected, respectively, to outer and inner terminals of a given first load, such as a first speaker, a second bridge amplifier having an outer drive terminal and an inner drive terminal connected, respectively, to outer and inner terminals of a second given load, such as a second speaker, and a mode switch to dynamically connect and disconnect the first and second bridge amplifiers from one another to switch the dual mode class SB amplifier between a serial amplification mode and a separate amplification mode.

According to one or more embodiments, the dual mode class SB amplifier receives a given system power Vdd, the first bridge amplifier receives a first given drive signal that dictates the power delivered to the first load and the second bridge amplifier receives a given second drive signal that dictates the power to be delivered to the second load.

According to one or more embodiments, based on the magnitude of the first drive signal and the magnitude of the second drive signal, a dynamic switch control circuitry opens and closes the mode switch to switch the dual mode class SB amplifier between the serial amplification mode and the separate amplification mode. Different aspects of the exemplary embodiments encompass different conditions and thresholds applied by the dynamic switch control circuitry to the detected magnitude of the first and second drive signals to generate the control signal opening and closing the mode switch.

According to the various exemplary embodiments, when the mode switch is closed to place dual mode class SB amplifier in the serial amplification mode, the inner drive terminal of the first bridge amplifier is connected to the inner drive terminal of the second bridge amplifier. A serial conducting path is then established, starting at, for example, the outer drive terminal of the first bridge amplifier, through the first load to the inner drive terminal of the first bridge amplifier, through the mode switch connecting the inner drive terminal of the first bridge amplifier to the inner drive terminal of the second bridge amplifier, through the second load, and ending at the outer drive terminal of the second bridge amplifier.

The serial conducting path provides for a sharing of current between the first current through the first load and the second current through the second load which, in turn, provides a substantial statistical improvement in power efficiency, as will be understood by persons of ordinary skill in the upon reading this entire disclosure.

Dual bridge class SB amplifiers according to one or more of the exemplary embodiments employ and exploit this switch feature to provide various advantages such as, for example, the previously described improvement in power efficiency and reduction in amplifier heat.

Another example benefit of class SB amplifiers according to the various exemplary embodiments is that the dynamically controlled switch, even when closed to connect the front and rear bridge amplifiers, is not in the signal path. Instead, referring to the above-described example two-channel class SB amplifier, the two outputs of the front bridge amplifier connect to the two terminals of the front speaker, and the two outputs of the rear bridge amplifier connect to the two terminals of the rear speaker. These connections remain regardless of whether the dynamically controlled switch is open or closed. This provides a significant benefit of minimal switching noise, and will be more fully understood upon reading this disclosure in its entirety.

In the separate mode of amplification, the first bridge amplifier receives all of the first current from a given system power supply, passes the first current through the first load, and returns all of the first current to the system ground. Likewise, the second bridge amplifier, operating in the serial mode of amplification, receives all of the second current from the given system power supply, passes the second current through the second load, and returns all of the second current to the system ground. The various exemplary embodiments include an aspect to minimize the percentage of time, or statistical probability, that the dual mode class SB amplifier is not in its series amplification mode.

According to one exemplary embodiment, one example amplifier includes a dual bridge dynamically switched mode amplifier comprising, in combination with other described structures, a control circuit for detecting the amplitude of a first given input signal and the amplitude of a second given input signal and for generating a mode switch signal based on the first and the second input signals. The one example may include a first bridge amplifier having an outer differential amplifier having a pair of differential inputs and an output and an inner differential amplifier having a pair of differential inputs and an output, and a resistor feedback network having a first common node connected through a resistor to one of the differential inputs of the outer differential amplifier and connected through a resistor to one of the differential inputs of the inner differential amplifier. The one example may further include a second bridge amplifier having an outer differential amplifier having a pair of differential inputs and an output and an inner differential amplifier having a pair of differential inputs and an output, and a resistor feedback network having a second common node connected through a resistor to one of the differential inputs of the outer differential amplifier and connected through a resistor to one of the differential inputs of the inner differential amplifier. The one example may further include a first: common node current compensator connected to the first common node to source or sink a first node compensation current based on one of the first and second input signals, and a second common node current compensator connected to the second common node to source or sink a first node compensation current based on the other of the first and second input signals. The one example may, in addition, include a mode switch for switching, based on the mode switch signal, between a closed position connecting the output of the inner differential amplifier of the first bridge amplifier to the output of the inner differential amplifier of the second bridge amplifier, and an open position terminating the connection. The one example may further include a buffer compensator connected to the inner differential amplifier of the first bridge amplifier and to the inner differential amplifier of the second bridge amplifier circuit, to equalize the magnitude and direction of current flow to and from the respective outputs of the inner differential amplifier The above summary of various illustrative examples of advances and advantages of the exemplary embodiments should not be understood as exhaustive list or to be a limit of the possible advantages that may be realized. On the contrary, various other advantages will be apparent to persons of ordinary skill in the art upon reading this disclosure, as well as various alternative embodiments that are within the scope of the appended claims.

DETAILED DESCRIPTION

Various exemplary embodiments are described in reference to specific illustrative examples. The examples are included to further assist a person of ordinary skill in the art to form a clear understanding of, and to practice the invention. The scope of embodiments, however, is not limited to the specific illustrative examples that are presented. Instead, as will be readily recognized by persons of ordinary skill in the relevant arts based on this description, many other configurations and arrangements may be implemented.

As will be appreciated by persons of ordinary skill in the art, for clarity of illustration figures may not be drawn to scale. For example, certain depictions may have distortion of shape and/or exaggeration of relative proportions, for purposes of a clear depiction of a whole.

To avoid obscuring novel features and aspects, and as will be readily understood by persons of ordinary skill in the art upon reading this description, various details of algorithms and hardware that are well known to such persons are omitted, except where such details pertain to particular operations of the features and aspects.

Example embodiments and aspects may be described separately, or as having certain differences. Separate description or description of differences, however, does not necessarily mean the respective embodiments or aspects are mutually exclusive. For example, a particular feature, function, or characteristic described in relation to one embodiment may be included in, or adapted for other embodiments.

To assist a person of ordinary skill in the art to quickly form a sufficient understanding of the structures and operations of the embodiments to practice according to these and further embodiments, illustrative examples of various structure and operation are in reference to example audio-related applications. Audio, however, is not the only application, and persons of ordinary skill in the art will, upon reading this disclosure readily identify various other embodiments and applications.

One example system according to one exemplary embodiment may include a first bridge amplifier and a second bridge amplifier, combined with a dynamically controlled switch to connect and disconnect the bridge amplifiers from one another in accordance with input signal magnitudes, to form what is termed herein as a class "SB" amplifier. In one example two-channel class SB amplifier according to one embodiment, one of the two bridge amplifiers may be arbitrarily labeled as the "front" bridge amplifier, and the other of the bridge amplifiers may be arbitrarily labeled as the "rear" bridge amplifier. The front bridge amplifier may connect to opposite terminals of a front speaker and the rear bridge amplifier may connect to opposite terminals of a rear speaker. In a two channel (i.e., front and rear) example of one SB amplifier according to one or more embodiments, in both the serial mode and the separate mode, the front bridge amplifier receives an externally supplied signal, arbitrarily labeled for this description as Audio_Front(t), and the rear bridge amplifier receives an externally supplied signal, arbitrarily labeled for this description as Audio_Rear(t) signal.

The example Audio_Front(t) and Audio_Rear(t) signals may be assumed, for purposes of describing example aspects of example embodiments, to be low-power signals such, for example, outputs of a "preamplifier" or equivalent source, without sufficient power to drive high volume audio speakers. Illustrative examples of such sources include, without limitation, a stereo FM tuner, an MPEG music source such as, for example, an iPod, or any other of the various kinds and types of such signal sources. Further, the term "audio" within the arbitrary labels is only referencing illustrative operations of example embodiments applied to audio systems. The various exemplary embodiments are contemplated for use in a scope of application extending beyond audio. As will be described in greater detail in later sections, the Audio_Front(t) and Audio_Rear(t) signals may, or may not be, orthogonal to one another.

It will be understood that the embodiments require no specific limit or numeric value for Vdd. Such limits and example values may be in accordance with ordinary and customary amplifier and acoustic system design considerations. One illustrative example Vdd is +12 volts, and another is +24 volts.

According to one example dual channel class SB amplifier according to one or more embodiments, a switch control circuit dynamically opens and closes a switch between the front and rear bridge amplifiers to switch the class SB amplifier between two modes of amplification, one being a serial mode and the other being a separate mode. In an example class SB amplifier in which the front bridge amplifier connects to a front speaker and the rear bridge amplifier connects to the rear speaker, in both the serial mode and the separate mode, the Audio_Front(t) signal may control the amount of power delivered to the front speaker, and the Audio_Rear(t) signal may control the amount of power delivered to the rear speaker. However, as will be understood by persons of skill in the art upon reading this entire disclosure, in example two-channel SB amplifiers having one or aspects of one or more embodiments, signals such as the Audio_Front(t) and Audio_Rear(t) signal may not each have sole individual control of a respective front bridge amplifier and rear bridge amplifier.

In the serial mode of various example SB amplifiers according to the various and exemplary embodiments, however, the dynamically controlled switch, when closed, provides a current path wherein, for relative values of the Audio_Front(t) and Audio_Rear(t) in which the current through the front speaker flows in the same direction as the current through the rear speaker, at least a portion of the current may be shared by the two speakers. As will be further described in greater detail at later sections, the current sharing provided by the exemplary embodiments may be obtained even when the current flow through the front speaker and rear speaker are not equal. Instead, as will also be described in greater detail, various exemplary embodiments includes a novel arrangement of a buffer and current compensation circuits to control the front and rear bridge amplifiers to source or sink the difference between the front speaker current and rear speaker current.

According to one aspect of one or more of the various exemplary embodiments, the threshold condition causing the dynamically controlled switch to open and close is a fixed value. Assuming an external power supply of voltage Vdd powers all of the differential amplifiers (and other circuitry of the amplifier system), in one example according to one aspect, the threshold may be approximately Vdd/2. In such an example, a comparator or equivalent circuit of the dynamic switch control circuit detects the magnitude of both Audio_Rear(t) and Audio_Front(t) (or an amplified or attenuated version of these signals) and, provided the magnitude of both is less than Vdd/2, generates a switch control signal that maintains the switch closed.

According to another aspect of one or more of the exemplary embodiments, instead of a fixed switching threshold to open and close the switch, an adaptive threshold is provided to open and close the switch based on the relative and absolute values of the first drive signal and the second drive signal. In one example, according to one or more the adaptive switching threshold aspect, the dynamic switching control circuit, together with the bridge compensation current sources, and the buffer circuit, may be configured and arranged to dynamically vary the switching threshold based on an average of the first drive signal and the second drive signal.

According to one aspect of one or more example class SB amplifiers according to various other exemplary embodiments, a buffer circuit may be included to add current to (or subtract current from) the front common voltage node and the rear common voltage node, to further control the inner differential amplifier of the front bridge amplifier and the inner differential amplifier of the rear bridge amplifier, when the switch is closed, to ensure these amplifiers maintain the required voltage drop across the switch and to ensure that each of the inner differential amplifiers sources or sinks approximately the same amount of current. Stated differently, according to one or more aspects of one or more of the various exemplary embodiments, the buffer circuit may be configured and arranged to equalize the current sourced or sunk by the inner differential amplifiers, and to ensure a proper voltage difference across the switch so that the correct amount of shared current flows in the correct direction.

According to one aspect, the buffer circuit may include a feedback buffer control having, for example, a current detector to detect the current sourced or sunk by each of the inner differential amplifiers and, according to the difference between the detected currents, effecting a corresponding current flow to or from each of the front common voltage node and the rear common voltage node to drive the difference to zero.

According to another aspect, the buffer circuit may include a feed forward buffer control having, for example, a calculation circuit or function configured to detect Audio_Front(t) and Audio_Rear(t) and, based on their values, during intervals when the dynamically controlled switch is closed, flow the appropriate buffer compensation current to the front and rear common node of the front and rear bridge amplifiers.

As will be understood, class SB amplifiers according to one or more embodiments having the aspect of an adaptive switching threshold may provide a statistical increase in the percentage of time that the embodiments' class SB amplifiers may be maintained in the serial mode and, hence, be able to exploit the current sharing feature provided by the various embodiments and, therefore, may obtain a further statistical improvement in power efficiency.

Dual mode class SB amplifiers according to the exemplary embodiments, by providing the current sharing, and by doing so in a novel manner including dynamically switching between the serial amplification mode and the separate amplification mode provide various advantages such as, for example, the previously described improvement in power efficiency and reduction in amplifier heat.

As one illustrative example, when Audio_Front(t) is equal and opposite to Audio_Rear(t), and the dynamically controlled switch is in the closed position, it may be assumed that a current Z1 must pass through the front speaker and a current Z2 must pass through the rear speaker. Since Audio_Front(t) is equal to Audio_Rear(t), though, Z1 may be assumed equal to Z2 (assuming the front and rear speakers have the same characteristics), and therefore both may be labeled "Z". Assuming the voltage drop across the front and rear speakers due to Z is within a given limit, the dynamically controlled switch is closed, and the dual mode class SB amplifier is in the series amplification mode. The front bridge amplifier therefore outputs current Z, which passes through the front speaker and then to the other drive terminal of the front bridge amplifier. The other drive terminal is connected to one of the drive terminals of the rear bridge amplifier. Therefore, instead of the current Z being sunk by the other terminal of the front bridge amplifier, it flows through the switch to the connected drive terminal of the rear bridge amplifier, which is also connected to one of the terminals of the rear speaker. Because Audio_Rear(t) is equal and opposite to Audio_Front(t), however, the other drive terminal of the rear bridge amplifier, which is connected to the other terminal of the rear speaker, is at a lower voltage than the current Z that passed through the switch. The current Z passes through the rear speaker and is sunk by the other drive terminal of the rear bridge amplifier.

The above-described example operation saves considerable amplifier power because, instead of one current Z passing through two amplifiers in the front bridge amplifier and another current, equal to Z, passing through two amplifiers in the rear bridge circuit, one current Z passes through only one amplifier in the front bridge amplifier and sonly one amplifier in the rear bridge amplifier.

Another example benefit of class SB amplifiers according to the various exemplary embodiments is that the dynamically controlled switch, even when closed to connect the front and rear bridge amplifiers, is not in the signal path. Instead, referring to the above-described example two-channel class SB amplifier, the two outputs of the front bridge amplifier connect to the two terminals of the front speaker, and the two outputs of the rear bridge amplifier connect to the two terminals of the rear speaker. These connections remain regardless of whether the dynamically controlled switch is open or closed. This provides benefits such as, for example, minimal switching noise, and will be more fully understood upon reading this disclosure.

Figure 1:
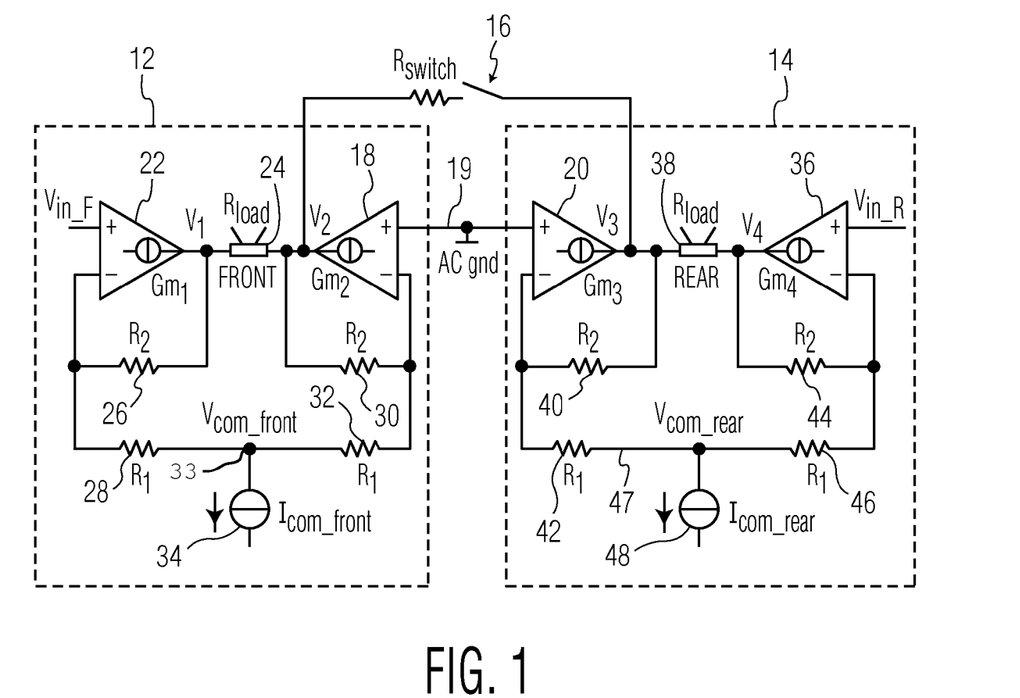
FIG. 1 shows one functional block schematic of particular included portions for forming one example dual bridge switched SB amplifier according to one or embodiments.

FIG. 1 shows one functional block schematic of one example partial model 10 of one or more dual bridge class SB amplifiers according to one or embodiments. As will be understood by persons skilled in the relevant arts upon reading this disclosure, the FIG. 1 schematic is termed a "partial model" 10 because it omits a particular compensation current generator (not shown in FIG. 1), by assuming that the switch 16 resistance is zero. At FIG. 5, one example dual bridge class SB amplifier according to one or embodiments, having one example implementation of the compensation current generator omitted from the FIG. 1 partial model 10 will be described. As will be further understood, this order of description is presented because it will assist persons of ordinary skill in the art to form an understanding sufficient to readily practice according to the embodiments.

Referring to FIG. 1, the depicted example partial model 10 is assumed to receive an example system power (not shown in FIG. 1) having a Vdd voltage. The absolute value of Vdd is not particular to the embodiments. Example illustrative structures and operations of dual bridge class SB amplifiers according to one or more embodiments, however, are best described in relation to Vdd, for reasons that are readily apparent to persons of ordinary skill in the art upon reading this entire disclosure. Regardless, for purposes of an illustrative example, Vdd may be +12 volts DC.

With continuing reference to FIG. 1, the example partial model 10 includes a first bridge amplifier 12 and a second bridge amplifier 14, switchably connected to one another by a mode switch 16. The various criteria and definitions of conditions on which the mode switch 16 is controlled, i.e., opened and closed, are described in greater detail at later sections. Circuitry for generating the signal(s) controlling the mode switch 16 is omitted from FIG. 1 because, upon reading the various criteria and conditions on which the mode switch 16 may be controlled, i.e., opened and closed, a person of ordinary skill in the art may readily design and construct a circuit performing the switch control function(s), applying only conventional engineering design knowledge to the present disclosure.

Figure 5:
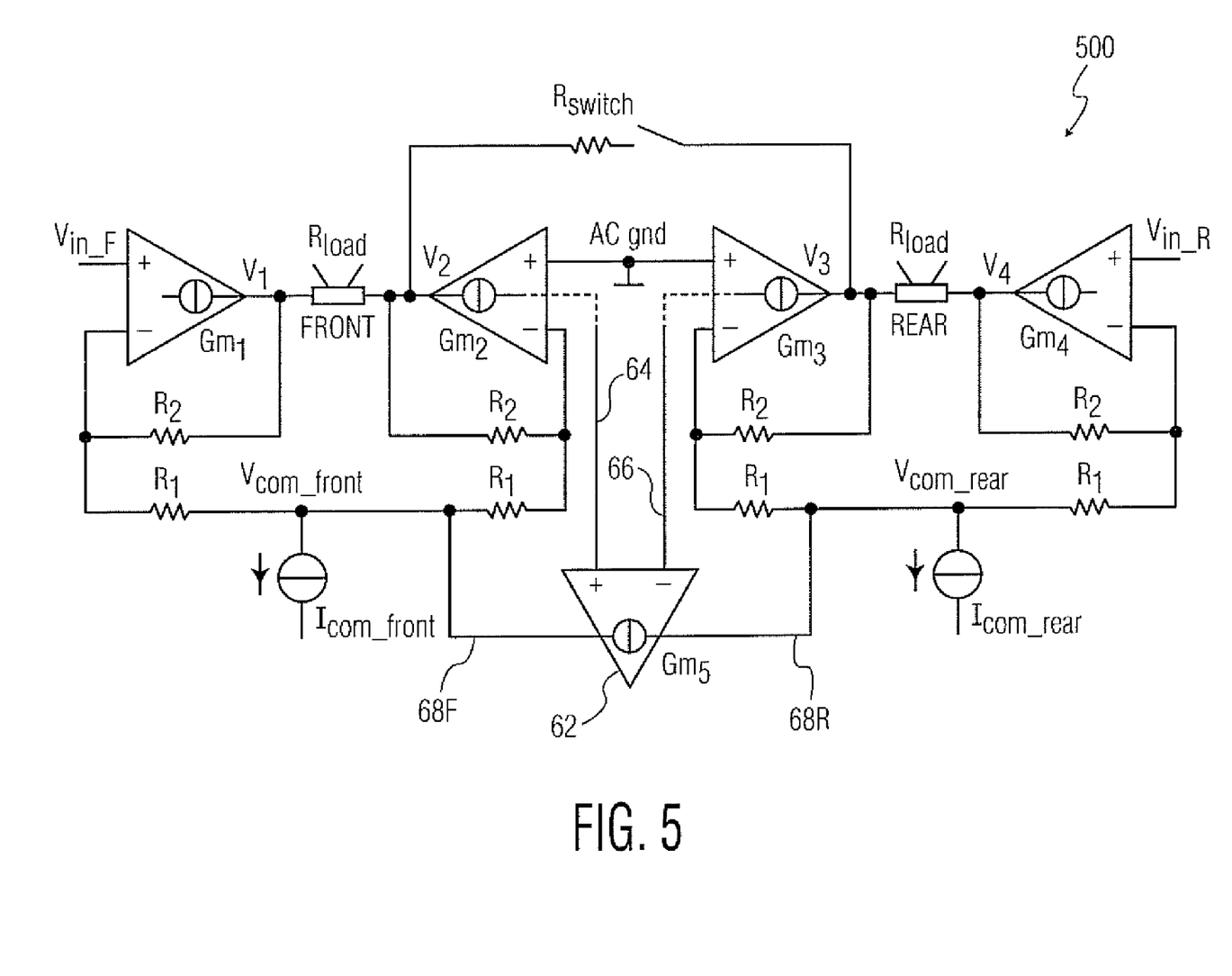
FIG. 5 shows one illustrative example dual bridge switched SB amplifier according to one or embodiments, including one implementation of one example switch voltage control circuit according to one feedback-type switch voltage control aspect.
Figure 6:
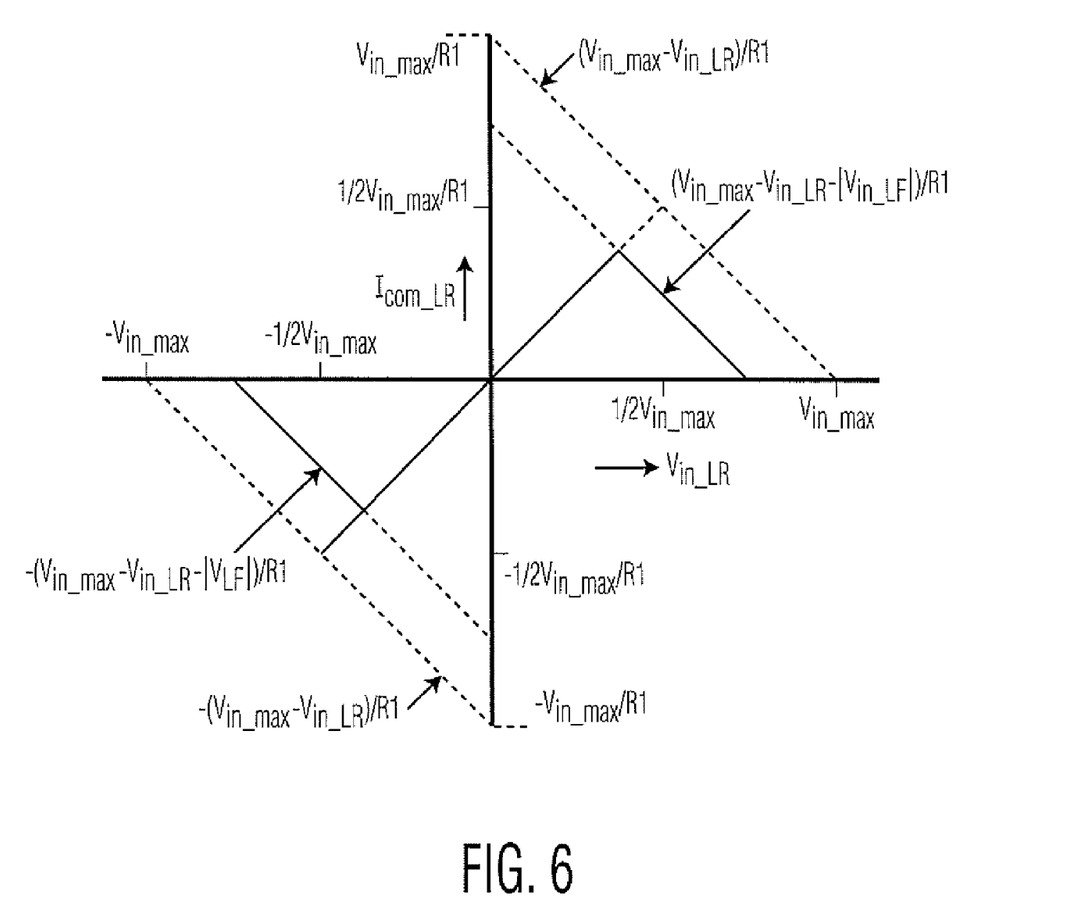
FIG. 6 shows one example graphical representation of one example current transfer function of one common node current compensation circuit of one adaptive node voltage aspect of one example multi-channel bridge switched SB amplifier according to one or more embodiments.

Referring again to FIG. 1, as described above, examples according to the various exemplary embodiments will be described in reference to an example environment having four speakers such as, for example, a front left, a rear left, a front right and a rear right speaker. The FIG. 1 example 10 (in a complete embodiment such as depicted at FIG. 5) may, for example, drive the left front and left rear speakers of such a four-speaker example. Consistent with such an example environment, the first bridge amplifier 12 will be referenced hereinafter as the "front" bridge amplifier 12, and the second bridge amplifier 14 will be referenced as the "rear" bridge amplifier 14.

With continuing reference to FIG. 1, the front bridge amplifier 12 and the rear bridge amplifier may, but are not necessarily, structurally identical. Description of examples will assume, however, for purposes of focusing this description on the novel aspects of the embodiments, that the front bridge amplifier 12 and the rear bridge amplifier 14 are structurally identical.

Referring to FIG. 1, the front bridge amplifier 12 includes a pair of differential amplifiers 18 and 22, the amplifier 18 termed an "inner" differential amplifier 18 and the amplifier 22 termed an "outer" differential amplifier 22. The output (not separately numbered) of the outer differential amplifier 22 connects to one terminal (not separately numbered) of a front speaker 24. In a like manner, the output (not separately numbered) of the inner differential amplifier 18 connects to the other terminal (not separately numbered) of the front speaker 24. The voltage at the output of the outer differential amplifier 22 is arbitrarily labeled "V1," and the voltage at the output of the inner differential amplifier 18 is arbitrarily labeled "V2," for purposes of reference in further detailed descriptions at later sections.

With continuing reference to FIG. 1, the outer differential amplifier 22 has a "+" terminal and a "−" terminal (neither being separately numbered). The "+" terminal receives an externally generated signal, arbitrarily labeled as Vin_F, which may, for example, be a front fader/splitter (not shown in FIG. 1) portion of a left channel of a two-channel stereo system (not shown in FIG. 1). The Vin_F may, for example, be the above-described example Audio_Front(t). In such an example, the other externally generated signal, Vin_R, shown as connected to the "+" input terminal of the outer differential amplifier 36 of the rear bridge amplifier 14, may be an inverted version of Vin_F, i.e., the counterphase of Vin_F The Vin_R signal may, for example, be the above-described example Audio_Rear(t) signal. Vin_F and Vin_R may or may not have the same magnitude, through, depending on the setting of, for example, a front-to-rear volume fader. Vin_F and Vin_R, however, are not necessarily counterphases of the same signal. On the contrary, unless Vin_F and Vin_R are identical to one another in phase and magnitude, dual mode class SB amplifiers, according to the various exemplary embodiments, will provide statistical improvement in the power efficiency.

Referring to FIG. 1, the "+" input of amplifier 18 is connected, via connection 19, to the "+" input of the inner differential amplifier 20 of the second, or rear bridge amplifier 14. As shown at FIG. 1, the connection 19 is termed " ", for reasons that will be readily apparent in view of further detailed descriptions at later sections. The "−" input terminal of the inner differential amplifier 18 is connected via feedback resistor 30 to the output (not separately numbered) of the amplifier and connected, via another feedback resistor 32, to the common node 33. As can be understood by persons skilled in the art, the resistors 30 and 32 form a feedback circuit to control the output voltage, labeled V2, of the inner differential amplifier 18. Likewise, the output (not separately numbered) of the outer differential amplifier 22 connects via feedback resistor 26 to the "−" input of the amplifier 22, and the "−" terminal also connects, through resistor 28, to the common node 33. The resistors 26 and 28 therefore form a feedback resistance circuit for the outer differential amplifier 22, and their ratio sets the V2/Vin_F gain. The FIG. 1 illustrative example shows resistor 26 as having an "R2" value and shows resistor 28 having an "R1" value. For purposes of description R2 may be assumed equal to R1, which sets the gain of the outer differential amplifier 22, with respect to the Vin_F input, as $V2=(1+R2/R1)=2$. Likewise, the R2 value of the resistor 30 may be assumed equal to the R1 value of the resistor 32. The absolute resistance values R1 and R2, i.e., the absolute resistance value of resistors 26, 28, 30, and 32 (as well as the corresponding resistors 40, 42, 44, and 46 of the rear bridge amplifier 14) are not particular to the present embodiments. Such values may be readily determined by persons of ordinary skill in the art by, for example, applying conventional amplifier design methods to the present disclosure.

With continuing reference to FIG. 1, a front bridge amplifier compensation current source 34 connects to the common node 33, and is configured to feed or sink a current Icom_front to, or from, the common node 33, based on one or the other of Vin_F and Vin_R.

According to one embodiment, termed the "fixed common node voltage" embodiment, Icom_front is based on Vin_F and, likewise, the Icom_rear current fed or sunk by the rear bridge compensation circuit 48 is based on Vin_R. As will be described in greater detail at later sections, a result of dual mode class SB amplifiers having the front and rear bridge compensation circuits 34 and 48 configured according to this aspect maintain the voltage Vcom_front at the front common node 33 equal to the voltage Vcom_rear at the rear common node 47 of the rear bridge amplifier 14.

The fixed common node voltage embodiments thereby maintain V2=V3. V2 and V3 are maintained equal to Vdd/2, which is the AC_Gnd voltage at the connection 19 between the "+" input terminal of the inner differential amplifier 18 of the front bridge amplifier 12 and the "+" input terminal of the inner differential amplifier 20 of the rear bridge amplifier 14. As will be described in greater detail at later sections, the fixed common node voltage embodiments also control the mode switch 16 to open, and thereby switch the dual mode class SB amplifier to the separate amplification mode, when either Vin_F (after being amplified to V1) exceeds Vdd/2, or Vin_R (after being amplified to V4 at the output of the outer differential amplifier 36 of the rear bridge amplifier 14) exceeds Vdd/2.

According other exemplary embodiments, collectively referenced as "adaptive common node voltage" embodiments, the front bridge amplifier compensation current source 34 connected to the front common node 33 sources or sinks, a current Icom_front that is based on the Vin_R signal. Likewise, the rear bridge amplifier compensation current source 48 connected to the rear common node 47 sources or sinks a current Icom_rear that is based on Vin_F. As will be described in greater detail at later sections, a result of the Icom_front and Icom_rear currents being generated in this manner is that V2 is set equal to V3, but at a common voltage that is the average of Vin_F and Vin_R, hence the name "adaptive common node voltage" embodiments.

With continuing reference to FIG. 1, the rear bridge amplifier 14 is configured identically to the front bridge amplifier 12. More particularly, the output terminal (not separately numbered) of the inner differential amplifier 20 (having voltage V3) connects to one terminal not separately numbered) of the second load 28. The other terminal of the second load 38 connects to the output terminal (not separately numbered) of the outer differential amplifier 36. Resistors 40 and 42 form a feedback circuit for the inner differential amplifier 20, connecting the output of the inner differential amplifier 20 to the "−" input of that amplifier 20 and to the common node 47. Resistors 44 and 46 form a feedback circuit connecting the output of the outer differential amplifier 36 to the "−" input terminal of that amplifier 36 and to the common node 47. Similar to the previously described front bridge amplifier compensation current source 34 connecting to the common node 33 of the front bridge amplifier 12, a rear bridge amplifier compensation circuit 48 connects to the common node 47 and is configured to feed or sink a current, Icom_rear, based on one or the other of Vin_F and Vin_R. Further, the given drive signal Vin_R is input to the "+" terminal of the outer differential amplifier 36.

Various example aspects of the front and rear bridge amplifier compensation circuits 34 and 48 will now be described, together with relevant operations of the mode switch 6.

In overview, the purpose of the front and rear bridge amplifier compensation circuits 34 and 48 goal is to keep V2 and V3 constant and equal to each other when the mode switch 6 is closed, placing the front and rear bridge amplifiers 12, 14 in series. In actual implementations, the only difference between V2 and V3 is the voltage over the mode switch 16, which is caused by the current passing from the output of the inner differential amplifier 18 of the front bridge amplifier 12 to the output of the inner differential amplifier 20 of the rear bridge amplifier 14, or vice versa, multiplied by Rswitch.

Ideally, Rswitch should be zero and, for purposes of assisting in focusing the description on the novel aspects of the embodiments, an ideal switch 16 will be assumed.

Referring to FIG. 1, the front bridge amplifier compensation circuit 34 and the rear bridge amplifier compensation circuit 48 may be configured to apply the currents Icom_front and Icom_rear, respectively, to the front common node 33 and the rear common node 47:

$$\text{Icom\_front} = \frac{\text{Vin\_F}}{R1}, \quad \text{(Eqn. 1)}$$

assuming the resistance of resistor 28 is $R1$ $$\text{Icom\_rear} = \frac{\text{Vin\_R}}{R1}, \quad \text{(Eqn. 2)}$$

assuming the resistance of resistor 46 is $R1$

The result is that V2 and V3 are constant and equal to AC ground. The entire input voltage Vin_F is across the R1 resistance of resistor 28, and the entire input voltage Vin_R is across the same R1 resistance of resistor 46. The common output voltage of the amplifiers (virtual mid-tap of the speaker) varies with half the output voltage When V1 reaches its maximum value (½Vdd), hereinafter referred to as Vin_max, the mode switch 16 must be opened, because the front and rear amplifiers 12, 14 cannot be switched in series anymore and V2 and V3 will become unequal. Now the common output voltage has to go back to AC ground. This can be achieved by controlling the front bridge amplifier compensation circuit 34 and the rear bridge amplifier compensation circuit 48 to apply the currents Icom_front and Icom_rear, after the absolute value of Vin_F or Vin_R hit Vmax and the switch 16 is opened and the dual mode class SB amplifier is switched to its separate amplification mode, based on the current, as follows:

$$\text{Icom\_front} = \frac{\text{Vin\_max} - \text{Vin\_F}}{R1} \quad \text{(Eqn. 3)}$$

$$\text{Icom\_rear} = \frac{\text{Vin\_max} - \text{Vin\_R}}{R1} \quad \text{(Eqn. 4)}$$

As can be seen from Eqn. Nos. 1-4, as long as both of Vin_F and Vin_R are within Vmax/2, the Icom_front and Icom_rear increase and decrease in direct proportion to Vin_F and Vin_R, respectively. When either of Vin_F or Vin_R exceeds Vmax/2, the corresponding common current Icom_front and/or Icom_rear starts to decrease, which means there is substantially no discontinuity in the common output voltage.

Figure 2:
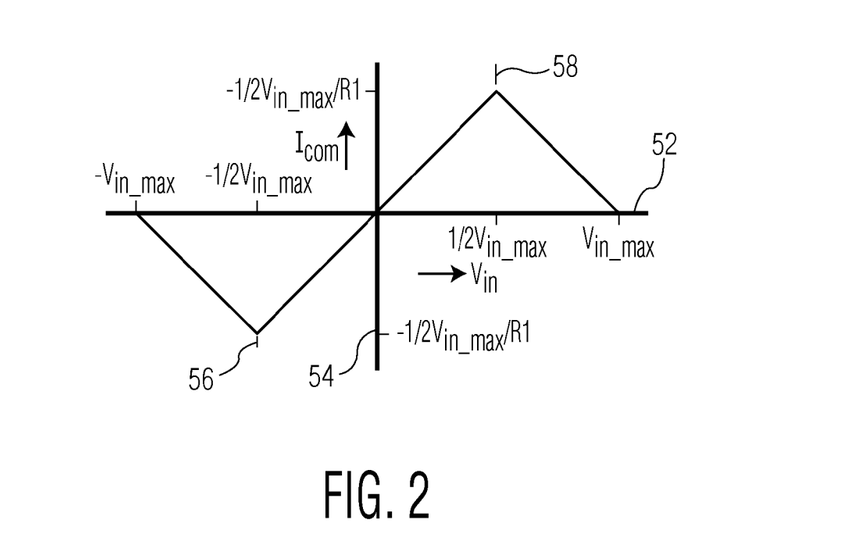
FIG. 2 shows one example graphical representation of one example current transfer function of one common node current compensation circuit of one fixed node voltage aspect of one example dual bridge switched SB amplifier according to one or more embodiments.
Figure 3:
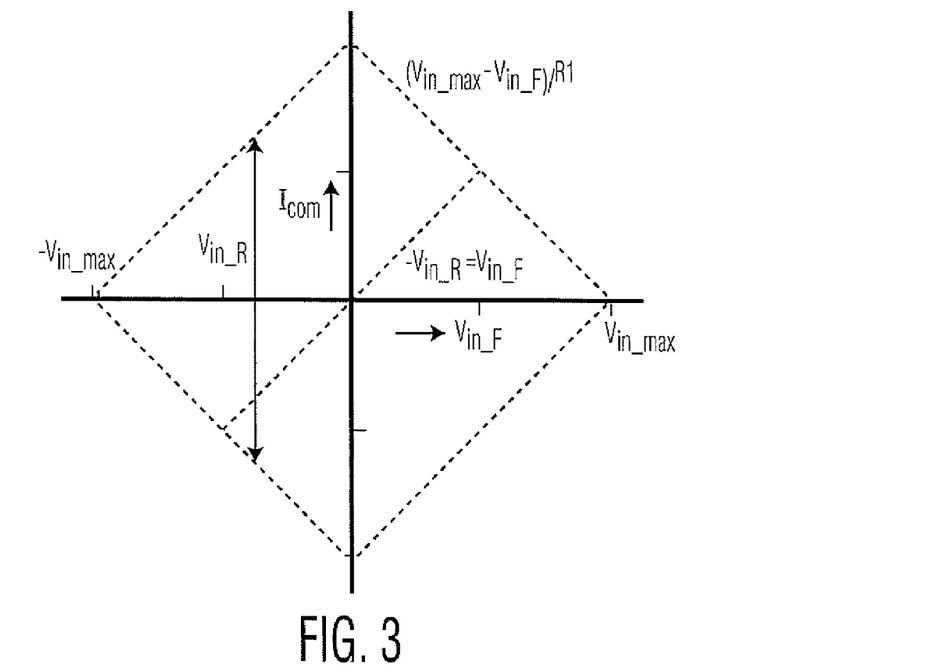
FIG. 3 shows one example graphical representation of one example current transfer function of one common node current compensation circuit of one adaptive node voltage aspect of one example dual bridge switched SB amplifier according to one or more embodiments.

FIG. 2 shows one example graphical representation of one example current transfer function, according to the example Equation Nos. 1-4, for controlling the front bridge amplifier compensation circuit 34 and the rear bridge amplifier compensation circuit 48 to source or sink the currents Icom_front and Icom_rear to achieve the necessary values of V2 and V3. The horizontal axis 52 represents the voltage Vin relative to the voltage, where "Vin" is Vin_F for referencing the FIG. 2 characteristic to the front bridge amplifier compensation circuit 34, and is Vin_R for referencing the FIG. 2 characteristic to the rear bridge amplifier compensation circuit 48. The vertical axis 54 represents the Icom current with respect to Vin, where "Icom" represents the Icom_front current when referencing FIG. 2 characteristic to the front bridge amplifier compensation circuit 34, and represents the Icom_rear current when referencing FIG. 2 characteristic to the rear bridge amplifier compensation circuit 48.

Referring to FIGS. 1 and 2, Equation Nos. 1 and 2 apply for the Vin voltage band between points 56 and 58 on FIG. 2, which is the band between negative Vmax/2 and positive Vmax/2, respectively, are the voltages at which mode switch 16 is closed. If Vin is above Vmax/2 or below negative Vmax/2m the mode switch 16 is open. For Vin voltages ranging from negative Vmax/2 to negative Vmax, Equation Nos. 3 and 4 apply, whereupon Icom decreases until Vmas is reached. If Vin goes below Vmax the voltage across at least one of the front and rear speakers will clip. Similarly, for Vin voltages ranging from positive Vmax/2 to positive Vmax Equation Nos. 3 and 4 also apply, and Icom decreases until Vmax is reached, beyond which the amplifier clips. If Vin goes above Vmax, the voltage across at least one of the front and rear speakers will clip.

It should be understood that the equations and relating description may have a minor approximation, because the gain of the outer differential amplifiers 22 and 36, in terms of their respective voltage out over voltage in, is:

$$\frac{V_{out}}{V_{in}} = 1 + \frac{R2}{R1}, \quad \text{(Eqn. 5)}$$

whereas the gain for the common mode injected signal at the tail is:

$$\frac{V_{out}}{V_{commontail}} = -\frac{R2}{R1} \quad \text{(Eqn. 6)}$$

The previous descriptions, referencing the partial model 10 of FIG. 1, describe generating V2 and V3 to be equal when the mode switch 16 is closed. However, regardless of the technology used for the mode switch 16, there is a resistance value, labeled on FIG. 1 as Rswitch. Therefore, for actual implementations, V2 and V3 must have a difference equal to the current passing through the mode switch 16 multiplied by Rswitch. If this difference is not provided, the current cannot flow. Further, if V2 and V3 are set to correspond to the voltage drop across the mode switch 16 then, as discovered by the present inventors, the currents sourced or sunk by the inner differential amplifiers 18 and 20 will have the same magnitude, and be in the same direction. Based on this information, it will be understood by persons of ordinary skill in the art, in view of the present disclosure, that the following two example means may be used to control V2 and V3. The first is a feedforward control such as, for example, calculating the required V2 and V3 and feeding this forward, for example, to the inner differential amplifiers 18 and 20. The second is a feedback control, implemented by, for example, detecting the current output (or sunk) by each of the inner differential amplifiers 18 and 20 and, based on the detected difference, source or sink an additional compensation current to the front common node 33 and the rear common node 47.

Figure 4:
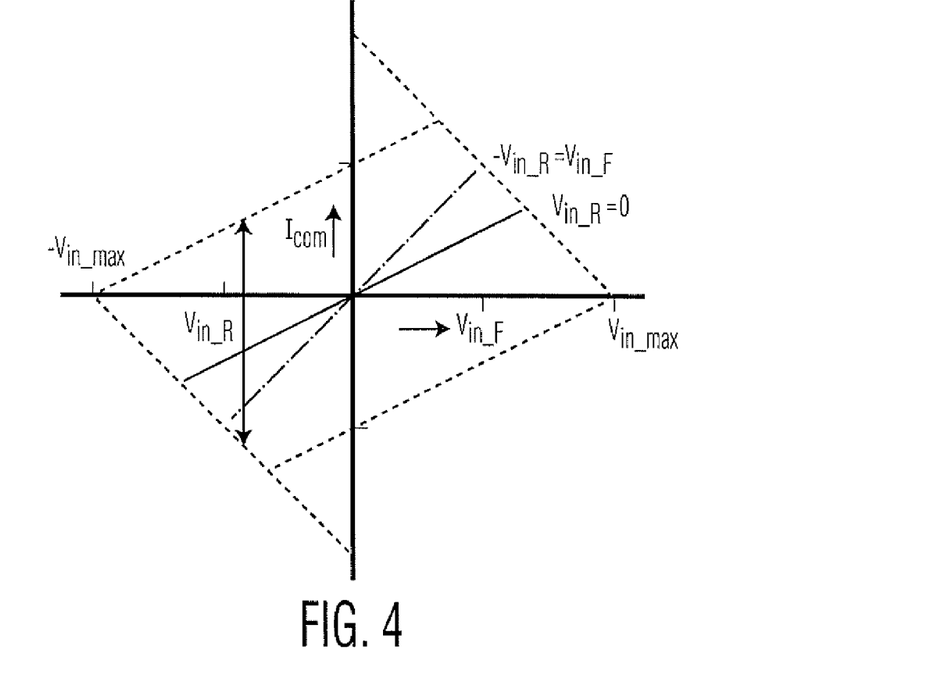
FIG. 4 shows one example graphical representation of one example current transfer function of one common node current compensation circuit of one quasi-adaptive node voltage aspect of one example dual bridge switched SB amplifier according to one or more embodiments.

FIG. 4 shows a graphical representation of an exemplary current transfer function of one common node current compensation circuit of one adaptive node voltage aspect of an exemplary dual bridge switched SB amplifier according to one or more embodiments.

FIG. 5 shows one example dual bridge switched SB amplifier 500 according to one or more embodiments, having one example implementation of an exemplary switch voltage control circuit according to one feedback-type switch voltage control aspect for controlling V2 and V3 as previously described. It will be understood that the FIG. 5 example 500 is depicted as a modification of the FIG. 1 partial model 10 and, therefore, like components and features are labeled with like reference numbers.

Referring to FIG. 5, in overview the present inventors have identified that for maximum efficiency, zero current should flow between the inner differential amplifiers 18 and 20 because, if this condition can be guaranteed, the current that is able to be shared between the front and the rear speakers 24, 28 will flow through the mode switch 16. One example means to guarantee the above-described condition is to measure the output currents of the inner differential amplifiers 18 and 20. Such measurement can be done by means of, for example, a scaled duplicate of these output currents.

With continuing reference to FIG. 5, the common amplifier 62, based on detecting the currents 64 and 66 of the inner differential amplifiers 18 and 20, outputs currents 68L and 68F, which forces the amplifiers' respective output currents to flow in the same direction, because current will flow through the mode switch 16 due to the change in the common mode voltages V2 and V3.

This solution exemplified by the FIG. 5 example 500 provides various significant benefits and advantages. One from among these benefits and advantages is that the differential amplifiers 18, 20, 22, and 36 operate in normal mode, reducing the distortion because V1 and V4 are compensated for the voltage across the mode switch 16.

Another from among these benefits and advantages is that the differential amplifiers 18, 20, 22, and 36 no longer need to be switched, so there is no additional switching distortion.

Still another from among the various advantages and features is that the resistance of the amplifiers remains low because the loads, e.g., the front load 24 and rear load 28 are voltage driven. Resistance of the mode switch 16 is not located in the signal path.

The additional control loop 62, 64, 66, 68L and 68R, only affects the common mode voltages because it is not in the signal path and, as previously described, the control loop also compensates for inaccuracy of the compensation currents Icom_front and Icom_rear generated by the front and rear compensation current sources 34 and 48.

According to one or more exemplary embodiments, the voltage V2 and V3 may be made adaptive such that a dual mode class SB amplifier according to one or more embodiments may be maintained in the series amplification mode for a higher percentage of time, or at a higher statistical probability. According to one aspect, this feature is obtained by adapting the common mode output voltage, i.e., V2 and V3 in the depicted example, to both of the input signals Vin_F and VinR. One example implementation according to this one aspect is to modify the FIG. 5 example 500, as well as its included partial model 10 depicted in FIG. 1, by applying different common currents at the tails than described by Equation Nos. 1-4 and depicted at FIG. 2. According to one aspect, the following equations may be used to generate the Icomp_front and Icomp_rear currents:

$$\text{Icom\_front} = \frac{-V'\text{in\_R}}{R1} \qquad \text{(Eqn. 7)}$$

$$\text{Icom\_rear} = \frac{-V'\text{in\_F}}{R1} \qquad \text{(Eqn. 8)}$$

The voltages V2 and V3 are then forced to be equal to:

$$\frac{V2}{\text{Gain}_{comm}} = -\frac{1}{2}V_{IN\_F} - \frac{1}{2}V'_{in\_R} \qquad \text{(Eqn. 7)}$$

$$\frac{V3}{\text{Gain}_{comm}} = -\frac{1}{2}V_{IN\_R} - \frac{1}{2}V'_{in\_F} \qquad \text{(Eqn. 8)}$$

The result is that V2 and V3 are equal to one another but, instead of being Vdd/2, they are the average of $V_{IN\_F}$ and $V_{IN\_R}$, subject to the following condition:

$$V'_{in\_F} = V_{in\_F} \text{ whereas } |V'_{in\_F}| \text{ is limited to } |V_{in\_max} - V_{in\_R}| \qquad (11)$$

$$V'_{in\_R} = V_{in\_R} \text{ whereas } |V'_{in\_R}| \text{ is limited to } |V_{in\_max} - V_{in\_F}| \qquad (12)$$

The above-identified conditions signals are coming from the differential path as well as the common path, [←FIX] but are equal to each other, which implies that the switch can be closed/opened. Substituting Vin_F=−Vin_R in the above Equation Nos. (9) and (10) results in the formulas for the fixed common node situation. When the sum of the input signals is larger than Vin_max the common mode current needs to be such that the output signal fits with in the supply voltage. According to equation 7 and 8, the common current can become too large. Therefore, the common current sources will be limited according to the conditions represented by Equation Nos. (11) and (12).

Figure 7:
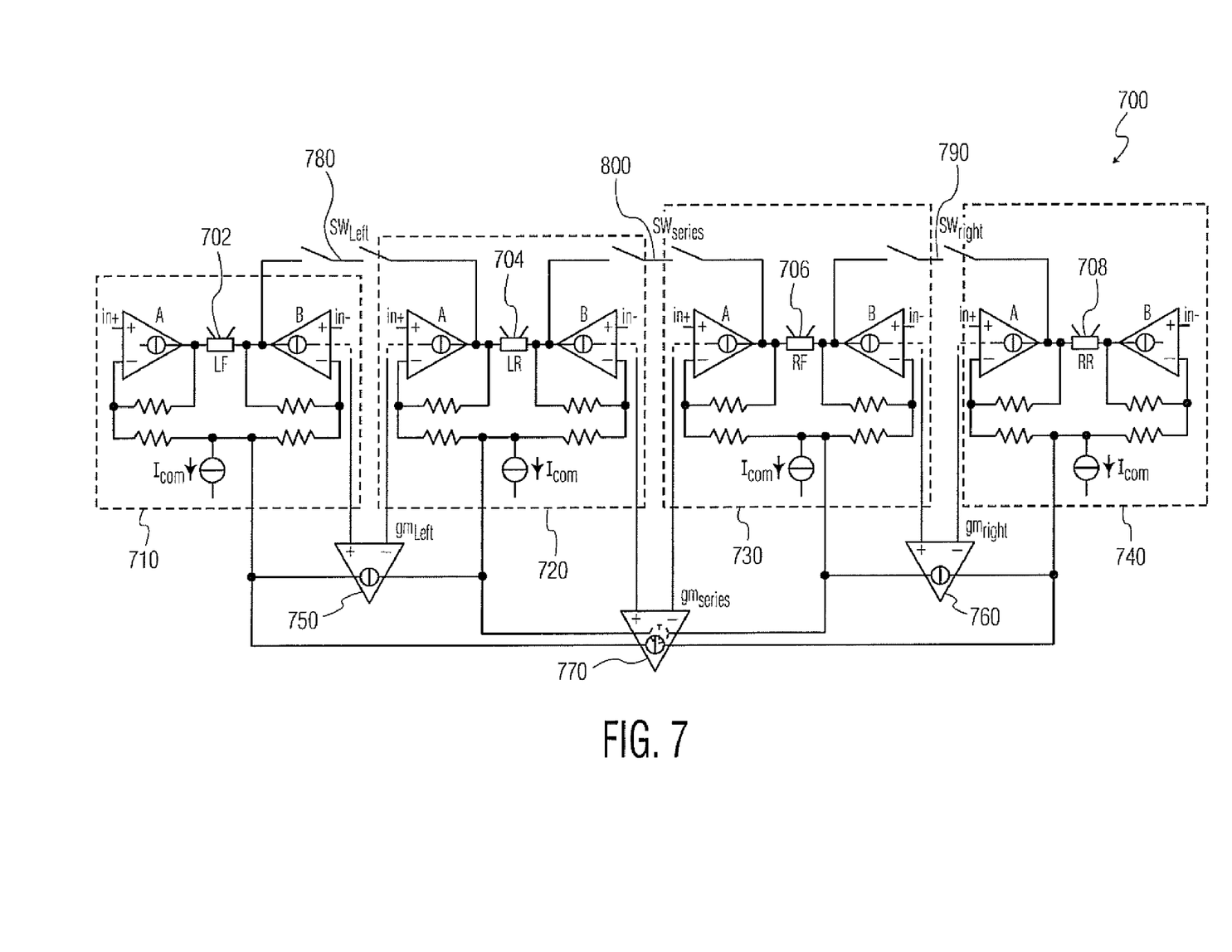
FIG. 7 shows one example four-channel channel bridge switched amplifier, according to one multi-channel bridge SB switched amplifier embodiments, having one example series switched multi-channel aspect.

FIG. 7 shows one example four-channel channel bridge switched amplifier system 700, according to one multi-channel bridge SB switched amplifier embodiment, having one example of one serial switched multi-channel aspect.

Referring to FIG. 7, the depicted example audio system 700 may, for example be for a vehicle (not shown), and may have left front 702, left rear 704, right front 706, and right rear 708 speakers. The audio system 700 may also comprise a first bridge amplifier 710 at the left front speaker 702, a second bridge amplifier 720 at the left rear speaker 704, a third bridge amplifier 730 at the right front speaker 706, and a fourth bridge amplifier 740 at the right rear speaker 708. With continuing reference to FIG. 7, in the depicted example 700*a* first feedback amplifier 750 is shown coupling the first bridge amplifier 710 to the second bridge amplifier 720, a second feedback amplifier 760 coupling the third bridge amplifier 730 to the fourth bridge amplifier 740, and a third feedback amplifier 770 coupling the second bridge amplifier 720 to the third bridge amplifier 730. A switch such as, for example, the depicted first switch 780 may couple the left front speaker 702 to the left rear speaker 704, another switch such as, for example, the depicted second switch 790, may couple the right front speaker 706 to the right rear speaker 708, and another switch such as, for example, the depicted third switch 800 may couple the left rear speaker 704 to the right front speaker 706.

Referring to the FIG. 7 example 700, of the bridge amplifiers 710, 720, 730, and 740 in FIG. 7 further comprises a first differential amplifier 712 having a first pair of differential inputs and a first output and a second differential amplifier 714 having a second pair of differential inputs and a second output, and a first resistor feedback network 716 having a first common node connected through a first resistor to a differential input of the first differential amplifier 712 and connected through a second resistor to a differential input of the second differential amplifier 714.

Figure 8:
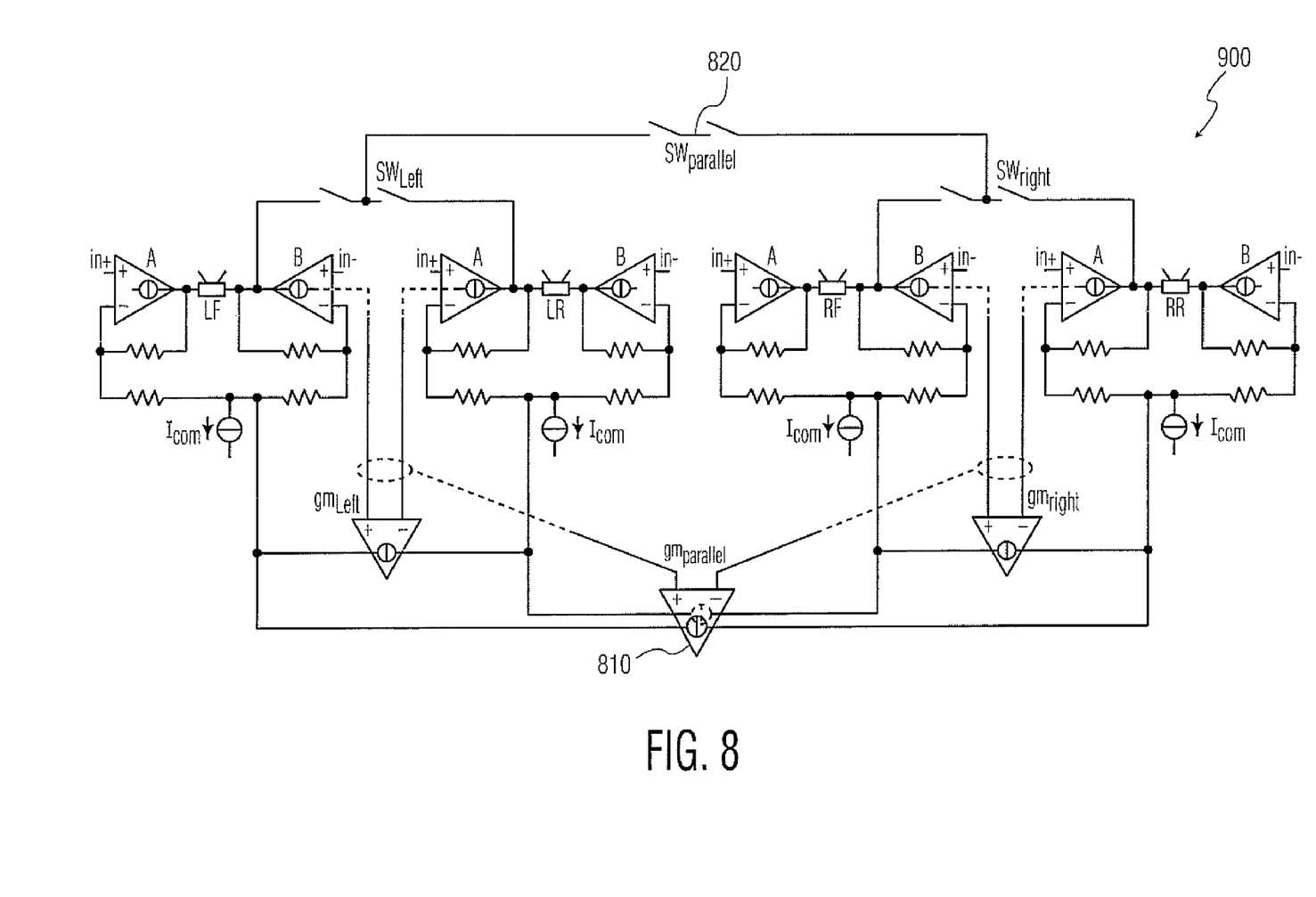
FIG. 8 shows one example four-channel channel bridge switched amplifier, according to one multi-channel bridge SB switched amplifier embodiments, having one example parallel switched multi-channel aspect.

FIG. 8 shows one example four-channel channel bridge switched amplifier 900, which is one example according to one multi-channel bridge SB switched amplifier embodiment, having one example parallel switched multi-channel aspect.

Referring to FIG. 8, depicted is an audio system 900 for a vehicle having left front 702, left rear 704, right front 706, and right rear 708 speakers, the audio system 800 comprising a first bridge amplifier 710 at the left front speaker 702; a second bridge amplifier 720 at the left rear speaker 704; a third bridge amplifier 730 at the right front speaker 706; a fourth bridge amplifier 740 at the right rear speaker 708; a first feedback amplifier 750 coupling the first bridge amplifier 710 to the second bridge amplifier 720; a second feedback amplifier 760 coupling the third bridge amplifier 730 to the fourth bridge amplifier 740; a third feedback amplifier 810 coupling the first feedback amplifier 750 to the second feedback amplifier 760; a first switch 780 coupling the left front speaker 702 to the left rear speaker 704; a second switch 790 coupling the right front speaker 706 to the right rear speaker 708; and a third switch 820 coupling the first switch 780 to the second switch 790.

Although various examples according to one or more examples of the various embodiments have been described in detail, and the descriptions include particular reference to examples of certain aspects, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

We hereby claim:

1. A dual bridge dynamically switched mode amplifier comprising:
 a control circuit that detects a first amplitude of a first given input signal and a second amplitude of a second given input signal and that generates a mode switch signal based on the first and the second input signals;
 a first bridge amplifier having a first differential amplifier having a first pair of differential inputs and a first output and a second differential amplifier having a second pair of differential inputs and a second output, and a first resistor feedback network having a first common node connected through a first resistor to a differential input of the first differential amplifier and connected through a second resistor to a differential input of the second differential amplifier;
 a second bridge amplifier having a third differential amplifier having a third pair of differential inputs and an output and a fourth differential amplifier having a fourth pair of differential inputs and an output, and a second resistor feedback network having a second common node connected through a third resistor to a differential input of the third differential amplifier and connected through a fourth resistor to a differential input of the fourth differential amplifier;
 a first common node current compensator connected to the first common node to source or sink a first node compensation current based on one of the first and second input signals;
 a second common node current compensator connected to the second common node to source or sink a second node compensation current based on the other of the first and second input signals;
 a mode switch that switches, based on the mode switch signal, between a closed position connecting an output of the second differential amplifier to an output of the fourth differential amplifier of the second bridge amplifier, and an open position that terminates the connection; and
 a buffer compensator connected to the second differential amplifier and to the fourth differential amplifier that equalizes a magnitude and direction of current flow to and from respective outputs of said second and fourth differential amplifiers.

2. The dual bridge dynamically switched mode amplifier of claim 1,
 wherein one of the differential inputs of the second differential amplifier is connected to one of the differential inputs of the fourth differential amplifier.

3. The dual bridge dynamically switched mode amplifier of claim 2,
 wherein the first common node current compensator sources and sinks the first node compensation current based on the first input signal,
 wherein the second common node current compensator sources and sinks the second node compensation current based on the second input signal,
 and wherein the first resistor feedback network and the second resistor feedback network, in response to the current sourced and sunk by the first common node current compensator and the second common node current compensator, control the second differential amplifier and the fourth differential amplifier to have approximately equal voltages.

4. The dual bridge dynamically switched mode amplifier of claim 1, further comprising:
 a fifth differential amplifier having a positive terminal coupled to the second differential amplifier and a negative terminal coupled to the fourth differential amplifier, wherein the fifth differential amplifier controls both the first common node and the second common node so that first node compensation current and the second node compensation current are equal.

* * * * *